United States Patent
Shi et al.

(10) Patent No.: US 9,799,709 B2
(45) Date of Patent: Oct. 24, 2017

(54) PIXEL UNIT, METHOD OF MANUFACTURING THE SAME AND DISPLAY DEVICE

(71) Applicant: BOE TECHNOLOGY GROUP CO., LTD., Beijing (CN)

(72) Inventors: Lei Shi, Beijing (CN); Lujiang Huangfu, Beijing (CN); Xiaowei Xu, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 59 days.

(21) Appl. No.: 14/648,125

(22) PCT Filed: Aug. 15, 2014

(86) PCT No.: PCT/CN2014/084511
§ 371 (c)(1),
(2) Date: May 28, 2015

(87) PCT Pub. No.: WO2015/172450
PCT Pub. Date: Nov. 19, 2015

(65) Prior Publication Data
US 2016/0260786 A1     Sep. 8, 2016

(30) Foreign Application Priority Data

May 16, 2014   (CN) .......................... 2014 1 0208922

(51) Int. Cl.
*H01L 27/32*       (2006.01)
*H01L 51/00*       (2006.01)
(Continued)

(52) U.S. Cl.
CPC ...... *H01L 27/3246* (2013.01); *H01L 51/0023* (2013.01); *H01L 51/5209* (2013.01);
(Continued)

(58) Field of Classification Search
CPC ............. H01L 27/3246; H01L 51/0023; H01L 51/5209; H01L 51/5218; H01L 51/5225; H01L 51/56
See application file for complete search history.

(56) References Cited

U.S. PATENT DOCUMENTS

| 8,008,859 B2 | 8/2011 | Yang |
| 2008/0067506 A1 | 3/2008 | Takei et al. |
| 2009/0174320 A1* | 7/2009 | Kim .................... H01L 27/3246 313/504 |

FOREIGN PATENT DOCUMENTS

| CN | 1462477 A | 12/2003 |
| CN | 101049049 A | 10/2007 |

(Continued)

OTHER PUBLICATIONS

International Search Report in Chinese dated Jan. 5, 2015, for corresponding PCT Application No. PCT/CN2014/084511.

(Continued)

*Primary Examiner* — Anne Hines
(74) *Attorney, Agent, or Firm* — Kinney & Lange, P.A.

(57) ABSTRACT

The present invention discloses a pixel unit, a method of manufacturing the same and a display device. The pixel unit comprises an anode layer, a pixel definition layer, an organic light-emitting layer and a cathode layer, wherein the anode layer includes a plurality of pixel anodes in an array arrangement, and the pixel definition layer is disposed on the anode layer and includes a plurality of spaced pixel definition units, wherein the pixel definition units correspond to the pixel anodes one by one, and each pixel definition unit delimits a light-emitting region on the corresponding pixel anode, and the organic light-emitting layer is provided within the light-emitting regions, and the cathode layer is provided on the (Continued)

organic light-emitting layer. The present invention remarkably increases light extraction efficiency by improving the structure of the pixel unit.

15 Claims, 3 Drawing Sheets

(51) Int. Cl.
  *H01L 51/56* (2006.01)
  *H01L 51/52* (2006.01)
(52) U.S. Cl.
  CPC ...... *H01L 51/5218* (2013.01); *H01L 51/5225* (2013.01); *H01L 51/56* (2013.01); *H01L 27/3241* (2013.01); *H01L 51/5206* (2013.01)

(56) References Cited

FOREIGN PATENT DOCUMENTS

| | | |
|---|---|---|
| JP | 2006236649 A | 9/2006 |
| JP | 2008004290 A | 1/2008 |
| TW | 201244222 A | 11/2012 |

OTHER PUBLICATIONS

Written Opinion in Chinese dated Jan. 19, 2015, for corresponding PCT Application No. PCT/CN2014/084511.
First Office Action for Chinese Priority Application No. 201410208922.1, dated Mar. 4, 2016, 6 pages.

* cited by examiner

PIXEL UNIT, METHOD OF MANUFACTURING THE SAME AND DISPLAY DEVICE

BACKGROUND OF THE INVENTION

Field of the Invention

The present disclosure relates to the technical field of display, and in particular, to a pixel unit, a method of manufacturing the same and a display device.

Description of the Related Art

A basic structure of an Organic Light-Emitting Diode (OLED) device is of a sandwich-like structure formed by connecting a thin and transparent layer of Indium Tin Oxide (ITO) to an anode of a power supply and providing a metal cathode, wherein the ITO layer has semiconductor characteristics. The whole structure comprises a hole transmission layer (HTL), a light-emitting layer (EL) and an electron transmission layer (ETL). When the power supply supplies a suitable voltage, holes of the anode and charges of the cathode will combine with each other in the light-emitting layer to generate light. Light with three primary colors, i.e., red color, green color and blue color (RGB), can be generated according to different recipes thereof to form basic colors.

Generally, external quantum efficiency of an OLED depends on internal quantum efficiency thereof and light extraction efficiency. At present, light extraction efficiency of the OLED device is mainly restricted by the following two factors:

1. Total reflection of the light at an electrode-air interface and a glass-air interface will restrict light extraction, because difference in refractive index between different medium materials is great; such difference in refractive index causes only light rays emitted from a light-emitting point source within a certain range of angle to exit, and thus no matter how many times the light out of this certain range of angle is reflected, it cannot escape out of the device to form exiting light, thereby being absorbed by the material inside the device finally;
2. The light reflected by the respective interfaces forms a waveguide mode in the medium material and is absorbed by the material through conduction.

FIG. 1 shows a schematic structural view of a cross-section of an OLED unit in the prior art. As shown in FIG. 1, the OLED unit comprises an anode layer 1, a pixel definition layer 2, an organic light-emitting layer 3 and a cathode layer 4. The anode layer 1 includes a plurality of pixel anodes in an array arrangement. The pixel definition layer 2 covers the anode layer 1, but does not cover the part of each pixel anode which will be used as a light-emitting region. The organic light-emitting layer 3 is located within the light-emitting region, and the cathode layer is disposed on the organic light-emitting layer 3. From the formed structure, it can be seen that spaces between the respective portions of the organic light-emitting layer 3 within the respective light-emitting regions are fully filled with the pixel definition layer 2. Furthermore, since the area of the pixel anode is substantially equal to that of the light-emitting region, the light L emitted from a side of the organic light-emitting layer 3 runs through a longer light path inside the pixel definition layer 2, and a part of the light L directly enters into a bottom glass substrate after passing through the pixel definition layer 2 and then is absorbed, such that this part of the light L cannot exit out of a display screen.

SUMMARY OF THE INVENTION

In order to solve the problem that light extraction efficiency of the OLED panel is low, the present invention proposes a pixel unit, a method of manufacturing the pixel unit and a display device, which can improve the light extraction efficiency.

According to an aspect of the present invention, there is provided a pixel unit, comprising an anode layer, a pixel definition layer, an organic light-emitting layer and a cathode layer, wherein the anode layer includes a plurality of pixel anodes in an array arrangement, and the pixel definition layer is disposed on the anode layer and includes a plurality of spaced pixel definition units, wherein the pixel definition units correspond to the pixel anodes one by one, and each pixel definition unit delimits a light-emitting region on the corresponding pixel anode, and the organic light-emitting layer is provided within the light-emitting regions, and the cathode layer is provided on the organic light-emitting layer.

In an embodiment, a spacing between any two adjacent pixel definition units is greater than that between two adjacent pixel anodes corresponding to the two adjacent pixel definition units, respectively.

In an embodiment, the height of the pixel definition unit is greater than a sum of thickness of the organic light-emitting layer and thickness of the cathode layer.

In an embodiment, the thickness of the pixel definition unit is between 3 μm and 5 μm, and the height of the pixel definition unit is between 1.3 μm and 2.0 μm.

In an embodiment, a spacing between any two adjacent pixel anodes is between 0.5 μm and 1.5 μm.

In an embodiment, a protruded surface of the pixel definition unit is a surface having a certain radian.

According to another aspect of the present invention, there is provided a method of manufacturing a pixel unit, comprising the steps of:

forming an anode layer and etching the anode layer to form a plurality of pixel anodes in an array arrangement;

forming a pixel definition layer on the anode layer and etching the pixel definition layer to form a plurality of spaced pixel definition units, the pixel definition units corresponding to the pixel anodes one by one, and each pixel definition unit delimiting a light-emitting region on a corresponding pixel anode;

forming an organic light-emitting layer within the light-emitting regions; and forming a cathode layer on the organic light-emitting layer.

In an embodiment, the method further comprises the step of thinning the thickness of the plurality of pixel definition units, such that a spacing between any two adjacent pixel definition units is greater than that between two adjacent pixel anodes corresponding to the two adjacent pixel definition units, respectively.

In an embodiment, the method further comprises the step of thinning sides of the plurality of pixel definition units to form protruded surfaces of the pixel definition units as having a certain radian.

The present invention also proposes a display device including the pixel unit as described above.

In the present invention, the pixel definition layer is formed or provided as a plurality of pixel definition units that are spaced from each other. Compared to the prior art, the thickness of the pixel definition layer surrounding the organic light-emitting layer is thinned, such that the light path of the light emitted from the organic light-emitting layer within the pixel definition units is shortened. The present invention increases the area of the pixel anode by reducing the spacing between any two adjacent pixel anodes. At the same time, since the thickness of the pixel definition layer is thinned, when the light emitted from the organic light-emitting layer is refracted at the pixel definition layer, the probability of the light being reflected by the pixel anodes is increased and the probability of the light being absorbed by the substrate is reduced, thereby significantly improving light extraction efficiency. Further, in the present invention, the protruded surface of the pixel definition unit is provided as a surface having a certain radian, so that the light is unlikely to be totally reflected when exiting from the protruded surface of the pixel definition unit and thus light loss of exiting light is reduced, thereby improving light extraction efficiency.

DETAILED DESCRIPTION OF EMBODIMENTS OF THE INVENTION

Purposes, technical schemes and advantages of the present invention will become more apparent by explaining embodiments of the present invention, in combination with the accompanying drawings, in detail.

In order to solve the problems in the prior art that the structure of the pixel definition layer adversely influences an extraction efficiency of a side exiting light, the light reflected by the anode is transmitted within the pixel definition layer through a longer light path and much energy of the reflected light is absorbed by the material, and the light is totally reflected when exiting the pixel definition layer and loss of the exiting light occurs, the present invention provides a pixel unit and a method of manufacturing the same, and a display device, which can shorten a light path of the light within the pixel definition layer, reduce light absorbing, prevent total reflection, improve light extraction efficiency of the OLED device, and hence improve external quantum efficiency of the OLED device.

Figure 1:
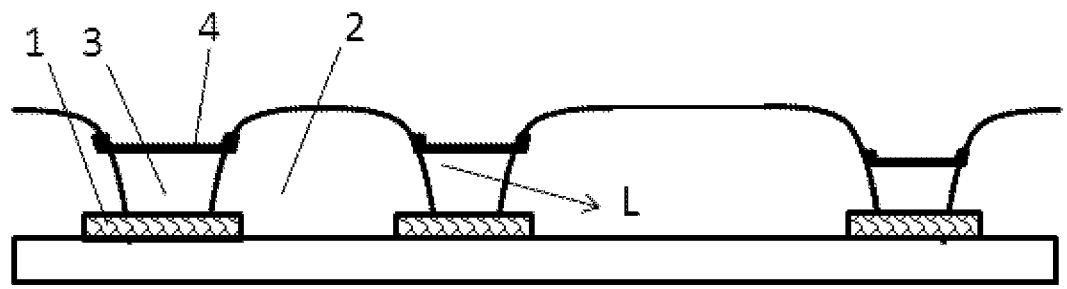
FIG. 1 is a schematic structural view of an OLED unit in the prior art.
Figure 2:
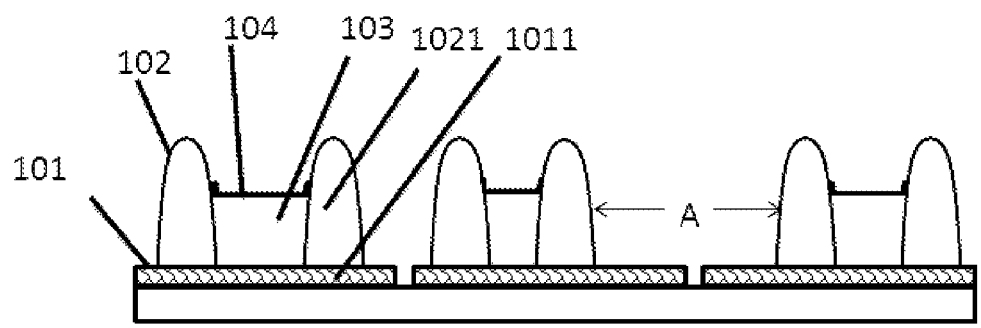
FIG. 2 is a schematic structural view of a cross-section of a pixel unit according to an embodiment of the present invention.

FIG. 2 shows a schematic structural view of a pixel unit according to an embodiment of the present invention. As shown in FIG. 2, the pixel unit comprises an anode layer 101, a pixel definition layer 102, an organic light-emitting layer 103 and a cathode layer 104. The anode layer 101 includes a plurality of pixel anodes 1011 in an array arrangement. The pixel definition layer 102 is disposed on the anode layer 101 and includes a plurality of spaced pixel definition units 1021. Each pixel definition unit has an encompassing structure. The pixel definition units 1021 correspond to the pixel anodes 1011 one by one. Each pixel definition unit 1021 defines a light-emitting region on the pixel anode 1011 corresponding to this pixel definition unit 1021. The organic light-emitting layer 103 is provided within the light-emitting regions. The cathode layer 104 is provided on the organic light-emitting layer 103.

The plurality of pixel anodes 1011 are distributed on a substrate in an array arrangement, and there is a spacing between any two adjacent pixel anodes 1011. Within tolerance of the manufacture processes, the spacing between any two adjacent pixel anodes 1011 may be as small as possible, so long as it can be ensured that no electric conduction occurs between the respective pixel anodes. The purpose for this is to make the area of the pixel anode 1011 as large as possible, so as to increase the area of the region which is not covered by the pixel definition units 1021. In this way, the light emitted from a side of the organic light-emitting layer 103, after being refracted by the pixel definition units 1021, can be reflected by the pixel anodes 1011 as much as possible.

Alternatively, the spacing between any two adjacent pixel anodes is between 0.5 μm and 1.5 μm.

The pixel definition units 1021 correspond to the pixel anodes 1011, one by one, and are provided on the pixel anodes 1011, respectively. The pixel definition unit 1021 has an encompassing structure, that is, its cross-section is of a ring shape. The pixel definition unit 1021 has a certain wall thickness, and the central region of the pixel definition unit 1021 is hollow and is used for delimiting a light-emitting region on the corresponding pixel anode. The organic light-emitting layer is provided within the light-emitting regions. In a case where the area of the organic light-emitting layer is not influenced, it is advisable that the spacing between any two adjacent pixel definition units 1021 is as large as possible.

Alternatively, the spacing between any two adjacent pixel definition units 1021 is greater than that between the two adjacent pixel anodes 1011 corresponding to the two adjacent pixel definition units, respectively.

As shown in FIG. 2, on each pixel anode 1011, there is provided a pixel definition unit 1021. There is a spacing region A between two adjacent pixel definition units 1021 provided on two adjacent pixel anodes 1011. In this way, the material of the pixel definition layer surrounding the organic light-emitting layer 103 can be reduced. In other words, the light exiting from the organic light-emitting layer 103 runs through a shorter light path within the pixel definition unit 1021, and the amount of energy absorbed by the material of the pixel definition layer is less, compared to the prior art. In the prior art, a space between two adjacent light-emitting regions is fully filled with the material of the pixel definition layer, such that the light exiting from the light-emitting layer in the light-emitting region runs through a longer light path within the pixel definition layer and much amount of the energy of the light will be absorbed by the material of the pixel definition layer.

Further, within tolerance of the manufacture processes, the spacing between two adjacent pixel anodes 1011 should be as small as possible. In this way, the area of the pixel anode 1011 can be increased. Moreover, in a case where the area of the light-emitting region can be ensured not be adversely influenced, the thickness of the pixel definition unit 1021 delimiting the light-emitting region should be ensured to be as thin as possible. Thus, the area of the part, which is covered by the pixel definition unit 1021, of the pixel anode 1011 will be relatively small. It can be seen from the structure that the spacing between two adjacent pixel definition units 1021 is greater than that between two adjacent pixel anodes 1011 corresponding to the two adjacent pixel definition units 1021 respectively, so that the area of the edge region, which is not covered by the pixel definition unit 1021, of the pixel anode 1011 become larger. In this way, not only the light exiting from a side of the organic light-emitting layer 103 travels through a shorter light path within the pixel definition layer, but also most of the light is reflected out of a display screen when the light is incident onto the edge region, which is not covered by the pixel definition unit 1201, of the pixel anode 1011, so that light extraction efficiency is improved.

Alternatively, the spacing between the pixel definition units 1021 can be increased by selecting the shape of the pixel definition unit 1021 and/or reducing the thickness of the pixel definition unit 1021 as much as possible. The cross-section of the pixel definition unit 1021 may be in a circular ring shape, an elliptical ring shape, a rectangular ring shape, a square ring shape or the like. The wall thickness of the pixel definition unit may be between 3 μm and 5 μm.

The organic light-emitting layer 103 is located within the light-emitting region delimited by the pixel definition unit 1021, so that the pixel definition unit 1021 surrounds the organic light-emitting layer 103.

Alternatively, the height of the pixel definition unit 1021 is greater than that of the organic light-emitting layer 103. Furthermore, the height of the pixel definition unit 1021 is greater than the sum of the thickness of the organic light-emitting layer 103 and the thickness of the cathode layer 104. The height of the organic light-emitting layer 103 is between 0.2 μm and 0.3 μm. The height of the pixel definition unit 1021 is between 1.3 μm and 2.0 μm, preferably 1.5 μm.

In the above structure according to the present invention, the plurality of pixel definition units 1021 are individual units separated from each other, and each pixel definition unit 1021 has a smaller thickness. Moreover, the spacing between any two adjacent pixel definition units is enough large, and the spacing between two pixel anodes 1011 corresponding to the two adjacent pixel definition units is enough small. In this way, the light exiting from the organic light-emitting layer 103 located within each pixel definition unit 1021 travels through a shorter light path within the pixel definition unit 1021, and after the light exits a side of the pixel definition unit 1021 and is refracted, most of the light will be incident onto the pixel anode 1011 and be reflected by the pixel anode to be outputted finally. Therefore, such structure can remarkably increase light extraction efficiency and reduce loss of light.

Further, a protruded surface of the pixel definition unit according to the present invention may be a surface having a certain radian, for example, as shown in FIG. 2, an arched surface. With such design, when the light exiting from the organic light-emitting layer 103 exits from the protruded surface of the pixel definition unit 1021, since an incidence angle of the exiting light can be reduced and then the incidence angle of the exiting light, which would be greater than a critical angle in the prior art, becomes less than the critical angle, total reflection of the exiting light inside a transparent covering layer can be reduced and hence light loss of the exiting light can be reduced, thereby further improving light extraction efficiency of the OLED device.

Figure 3:
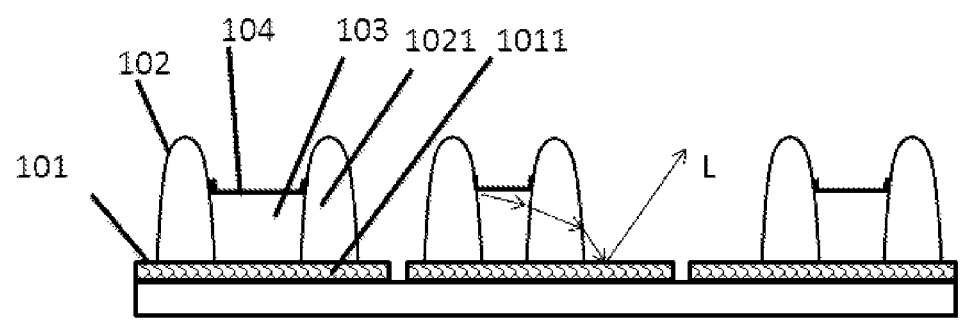
FIG. 3(a)-3(b) are schematic views of light paths by which the light emitted from a side of the organic light-emitting layer passes through the pixel definition unit.
Figure 3:
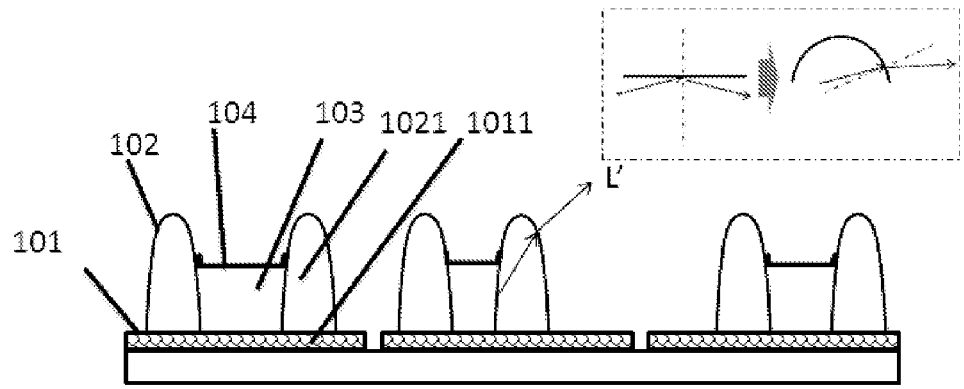

FIG. 3 shows a view of a light path when the light exiting from a side of the light-emitting layer passes through the pixel definition unit, in accordance with the present invention. As shown in FIG. 3(*a*), a part L of light emitting from the organic light-emitting layer 103 exits from a side of the pixel definition unit 1021 to enter an air and then is refracted. Most of the refracted light is incident onto the pixel anode 1011 and is reflected by the pixel anode 1011. The vast majority of the reflected light can directly exit to the outside. As shown in FIG. 3(*b*), another part L' of the light emitting from the organic light-emitting layer 103 exits from the protruded surface of the pixel definition unit 1021. Since an incidence surface of the part L' of light, i.e. the protruded surface, has a certain radian, an incidence angle of the part L' of light is much less compared to an incidence angle with respect to a flat incidence surface, so that probability of total reflection of the part L' of light can be reduced. A dashed block in FIG. 3(*b*) shows comparison between light paths with respect to a flat protruded surface and a protruded surface having a certain radian. It can be seen that the light, which would be totally reflected in the case of a flat surface, is not totally reflected and can directly exit to the outside in the case of a surface having a certain radian.

An embodiment of the present invention also provides a display device including the above-described pixel unit. With reference to the prior art, detailed description on other components of the display device will be omitted herein. The display device may be an electric paper, a TV, a displayer, a digital camera frame, a mobile phone, a flat computer or any other product or device that has a display function.

Figure 4:
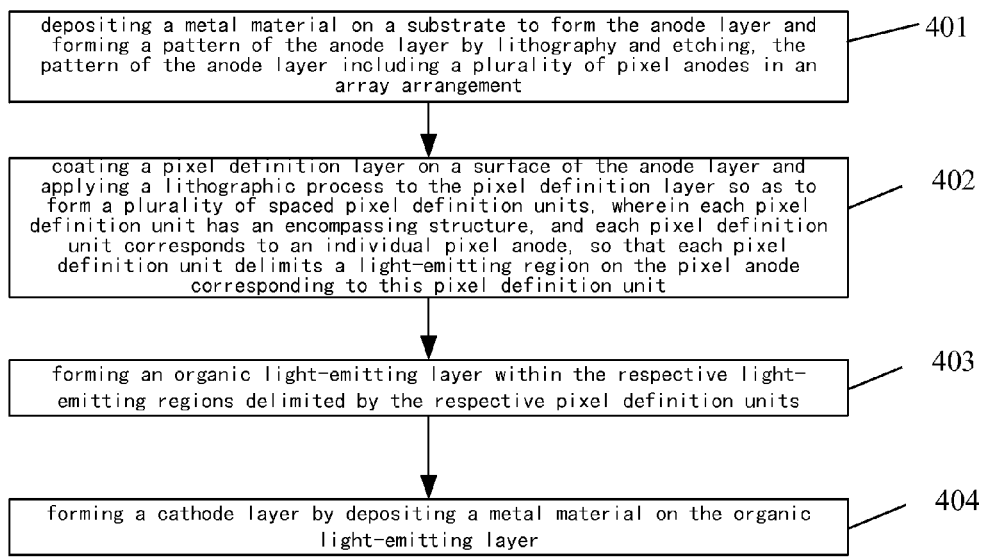
FIG. 4 is a flowchart of a method of manufacturing a pixel unit according to an embodiment of the present invention.
Figure 5:
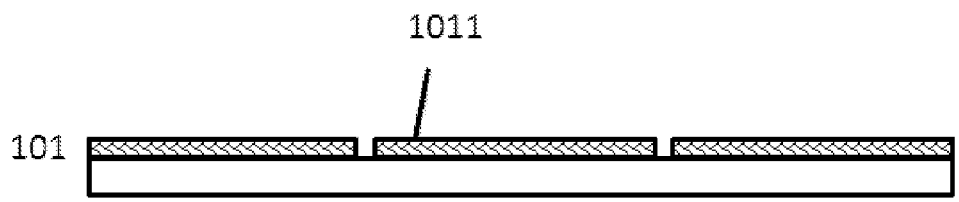
FIG. 5(a)-5(d) is a flowchart showing manufacture processes of a pixel unit according to an embodiment of the present invention.
Figure 5:
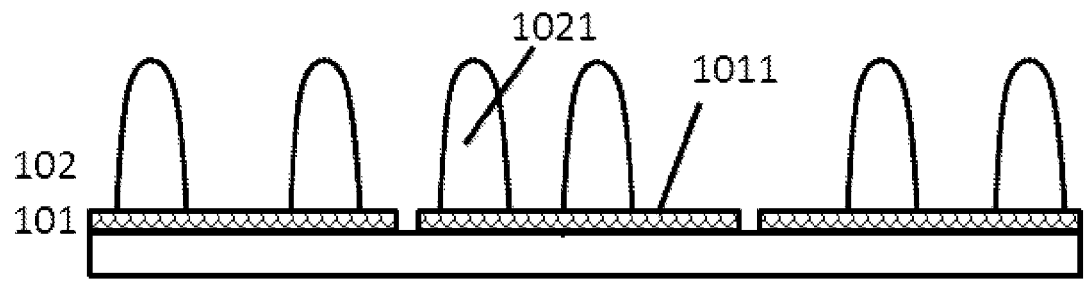
Figure 5:
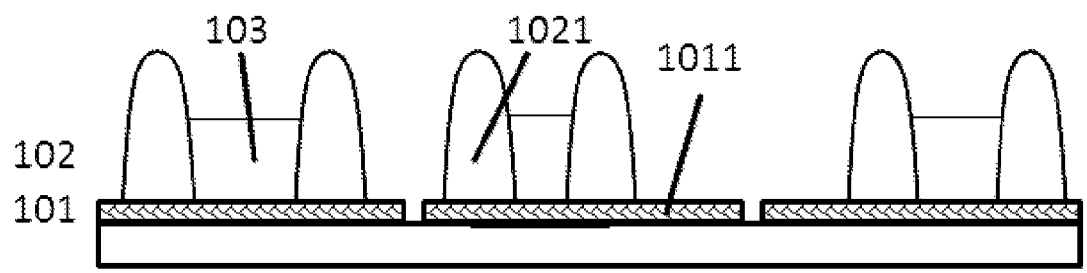
Figure 5:
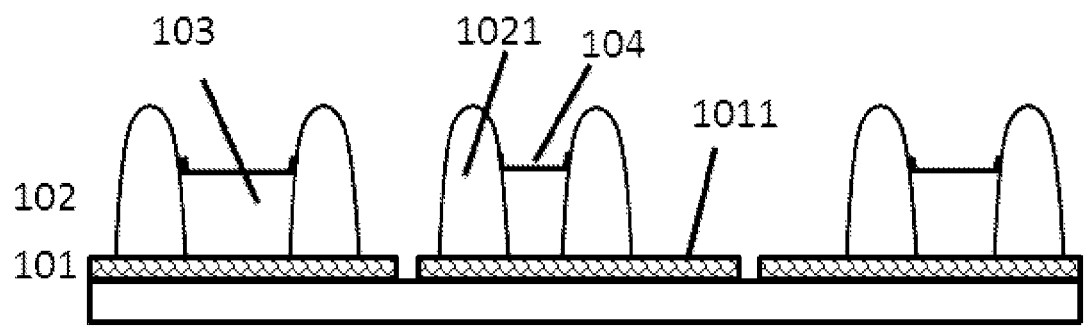

FIG. 4 shows a schematic flowchart of a method of manufacturing the pixel unit according to an embodiment of the present invention. FIGS. 5(*a*)-5(*d*) show manufacture processes of the pixel unit according to an embodiment of the present invention. As shown in FIGS. 4 and 5(*a*)-5(*d*), the method of manufacturing the pixel unit comprises:

Step 401: depositing a metal material on a substrate to form the anode layer 101 and forming a pattern of the anode layer by lithography and etching, the pattern of the anode layer including a plurality of pixel anodes 1011 in an array arrangement, as shown in FIG. 5(*a*).

Alternatively, the metal material used for forming the anode layer may be a metal material that is opaque and has a high reflectivity, such as silver or aluminum. The metal material may be deposited on the substrate by magnetron sputtering, heating evaporation or other film-forming methods, so as to form the anode layer.

Alternatively, when forming the plurality of pixel anodes in an array arrangement by lithography and etching, the area of the plurality of pixel anodes 1011 is made as large as possible, that is, the spacing between any two adjacent pixel anodes is as small as possible, so long as it can ensure that no electric conduction occurs between two adjacent pixel anode 1011. This is because the larger the area of each of the pixel anodes 1011 is, the less the probability of the light emitted from the organic light-emitting layer being incident onto the substrate is, and the less the light absorbed by the substrate is, thereby facilitating exiting of the light.

Alternatively, the spacing between two pixel anodes may be between 0.5 μm and 1.5 μm.

The method of manufacturing the pixel unit further comprises:

Step 402: coating a pixel definition layer 102 on a surface of the anode layer and applying a lithographic process to the pixel definition layer 102 so as to form a plurality of spaced pixel definition units 1021, as shown in FIG. 5(*b*), wherein each pixel definition unit 1021 has an encompassing structure having an opening portion, and each pixel definition unit 1021 corresponds to an individual pixel anode 1011, so that each pixel definition unit 1021 delimits a light-emitting region on the pixel anode 1011 corresponding to this pixel definition unit 1021, and the light-emitting region is disposed at the opening portion.

Alternatively, the material for the pixel definition layer is selected from insulating material having a high transmittance, in particular including transparent organic material, such as polyimide series or the like.

Alternatively, after forming the plurality of pixel definition units, the thickness of the pixel definition unit should be thinned as much as possible. The thickness of the pixel definition unit may be between 3 μm and 5 μm. Under the precondition of ensuring stability, the thickness of the pixel definition unit may be as thin as possible, so that a travel path of the light emitted from the organic light-emitting layer in the pixel definition unit can be reduced, and the region, that can be used for reflecting the light emitted from the organic light-emitting layer, on the pixel anode is increased, thereby facilitating exiting of the light. Furthermore, the region, that can be used for reflecting the light emitted from the organic light-emitting layer, on the pixel anode can be increased by selecting an appropriate shape for the pixel definition unit. The shape of the pixel definition unit comprises a circular ring shape, an elliptical ring shape, a rectangular ring shape, a square ring shape or the like.

Alternatively, the protruded surface of the pixel definition unit is formed as a surface having a certain radian by thinning a side of the pixel definition unit. The value of the radian should be selected to reduce total reflection of the light on the protruded surface as much as possible.

The method of manufacturing the pixel unit further comprises:

Step 403: forming an organic light-emitting layer 103 within the respective light-emitting regions delimited by the respective pixel definition units 1021, as shown in FIG. 5(*c*).

Alternatively, the organic light-emitting layer 103 may be formed by sequentially evaporating various types of light-emitting materials into the light-emitting regions delimited by the pixel definition units 1021 by means of a reticle. The light-emitting materials are materials that form a hole injection layer, a hole transmission layer, a light-emitting layer, an electron transmission layer and an electron injection layer.

The organic light-emitting layer 103 is disposed at the opening portion of the pixel definition unit 1021, and the height of the organic light-emitting layer 103 is less than that of the pixel definition unit 1021. The height of the organic light-emitting layer 103 is between 0.2 μm and 0.3 μm, and the height of the pixel definition unit 1021 is between 1.3 μm and 2.0 μm, preferably 1.5 μm.

The method of manufacturing the pixel unit further comprises:

Step 404: forming a cathode layer 104 by depositing a metal material on the organic light-emitting layer 103, as shown in FIG. 5(*d*).

A layer of metal material is deposited on the substrate formed with the organic light-emitting layer 103. The metal material may be selected from any one of silver, aluminum and magnesium. The portion of the cathode layer that does not correspond to or face the organic light-emitting layer is removed by exposing and etching, and only the portion of the cathode layer that is provided on the surface of the organic light-emitting layer is retained.

Alternatively, in order to ensure light transmission, the thickness of the cathode layer is preferably between 0.1 μm and 0.3 μm, and transparent conductive material having a high light transmittance is selected to form the cathode layer.

Alternatively, the step 402 may comprise the following steps of:

step 4021: coating a layer of material for the pixel definition layer onto the anode layer;

step 4022: coating a layer of photoresist onto the layer of material for the pixel definition layer;

step 4023: exposing the photoresist by means of a reticle, and etching the layer of material for the pixel definition layer to form the plurality of spaced pixel definition units, each pixel definition unit corresponding to one pixel anode.

The present invention reduces the light path of the light within the pixel definition units by forming the pixel definition layer as the plurality of pixel definition units which are spaced from each other. The present invention increases the area of the pixel anode by reducing the spacing between any two adjacent pixel anodes and reducing the thickness of the pixel definition units surrounding the organic light-emitting layer, such that the light path of the light emitted from the organic light-emitting layer within the pixel definition layer is reduced, and thus the probability of the light being reflected by the pixel anodes is increased and the probability of the light being absorbed by the substrate is reduced, thereby significantly improving light extraction efficiency.

Further, in the present invention, the protruded surface of the pixel definition unit is provided as a surface having a certain radian, so that the light is unlikely to be totally reflected when exiting from the protruded surface of the pixel definition unit and thus light loss of exiting light is reduced, thereby improving light extraction efficiency.

Purposes, technical solutions and advantageous effects of the present invention have been further illustrated in the above specific embodiments. It should be understood that the above description is merely used to illustrate specific embodiments of the present invention, but not intended to limit the present invention. All of changes, equivalent alternatives, improvements, made within principles and spirit of the disclosure, should be included within the scope of claims of the present invention.

What is claimed is:

1. A pixel unit, comprising:
   an anode layer, including a plurality of pixel anodes in an array arrangement;
   a pixel definition layer, which is disposed on the anode layer and includes a plurality of spaced pixel definition units, wherein the pixel definition units correspond to the pixel anodes one by one, and each of the pixel definition units delimits a light-emitting region on the corresponding pixel anode;
   an organic light-emitting layer, provided within the light-emitting region; and
   a cathode layer, provided on the organic light-emitting layer;
   wherein a spacing between any two adjacent pixel definition units is greater than that between two adjacent pixel anodes corresponding to the two adjacent pixel definition units, respectively.

2. The pixel unit according to claim 1, wherein a height of each pixel definition unit is greater than a sum of a thickness of the organic light-emitting layer and a thickness of the cathode layer.

3. The pixel unit according to claim 2, wherein a thickness of each pixel definition unit is between 3 μm and 5 μm, and a height of each pixel definition unit is between 1.3 μm and 2.0 μm.

4. The pixel unit according to claim 2, wherein a spacing between any two adjacent pixel anodes is between 0.5 μm and 1.5 μm.

5. The pixel unit according to claim 1, wherein a thickness of each pixel definition unit is between 3 μm and 5 μm, and a height of each pixel definition unit is between 1.3 μm and 2.0 μm.

6. The pixel unit according to claim 1, wherein a spacing between any two adjacent pixel anodes is between 0.5 μm and 1.5 μm.

7. The pixel unit according to claim 1, wherein each pixel definition unit includes a protruded surface having a certain radian.

8. A display device including the pixel unit according to claim 1.

9. The display device according to claim 8, wherein a spacing between any two adjacent pixel definition units is greater than that between two adjacent pixel anodes corresponding to the two adjacent pixel definition units, respectively.

10. The display device according to claim 8, wherein a height of each pixel definition unit is greater than a sum of a thickness of the organic light-emitting layer and a thickness of the cathode layer.

11. The display device according to claim 8, wherein a thickness of each pixel definition unit is between 3 μm and 5 μm, and a height of each pixel definition unit is between 1.3 μm and 2.0 μm.

12. The display device according to claim 8, wherein a spacing between any two adjacent pixel anodes is between 0.5 μm and 1.5 μm.

13. The display device according to claim 8, wherein each pixel definition unit includes a protruded surface having a certain radian.

14. A method of manufacturing a pixel unit, comprising:
forming an anode layer and etching the anode layer to form a plurality of pixel anodes in an array arrangement;
forming a pixel definition layer on the anode layer and etching the pixel definition layer to form a plurality of spaced pixel definition units, the pixel definition units corresponding to the pixel anodes one by one, and each of the pixel definition units delimiting a light-emitting region on a corresponding pixel anode;
forming an organic light-emitting layer within the light-emitting region;
forming a cathode layer on the organic light-emitting layer; and
reducing a thickness of the plurality of pixel definition units, such that a spacing between any two adjacent pixel definition units is greater than that between two adjacent pixel anodes corresponding to the two adjacent pixel definition units, respectively.

15. The method of manufacturing the pixel unit according to claim 14, further comprising:
thinning lateral parts of the plurality of pixel definition units to form protruded surfaces of the pixel definition units having a certain radian.

* * * * *